United States Patent
Pan et al.

(10) Patent No.: US 6,784,450 B2
(45) Date of Patent: Aug. 31, 2004

(54) GRADED BASE GAASSB FOR HIGH SPEED GAAS HBT

(75) Inventors: Noren Pan, Wilmett, IL (US); Byung-Kwon Han, Evanston, IL (US)

(73) Assignee: MicroLink Devices, Inc., Niles, IL (US)

(*) Notice: Subject to any disclaimer, the term of this patent is extended or adjusted under 35 U.S.C. 154(b) by 0 days.

(21) Appl. No.: 10/200,900

(22) Filed: Jul. 22, 2002

(65) Prior Publication Data

US 2003/0025179 A1 Feb. 6, 2003

Related U.S. Application Data

(60) Provisional application No. 60/306,796, filed on Jul. 20, 2001.

(51) Int. Cl.[7] .............................................. H01L 29/06
(52) U.S. Cl. .......................... 257/19; 257/18; 257/197; 257/198
(58) Field of Search .................... 257/18, 19, 197, 257/198, 190

(56) References Cited

U.S. PATENT DOCUMENTS

| | | | |
|---|---|---|---|
| 5,177,583 A | * | 1/1993 | Endo et al. .................. 257/190 |
| 5,349,201 A | * | 9/1994 | Stanchina et al. ............ 257/18 |
| 6,392,258 B1 | | 5/2002 | Hirata et al. ................. 257/197 |
| 2002/0145137 A1 | * | 10/2002 | Moll et al. ..................... 257/19 |
| 2002/0149033 A1 | * | 10/2002 | Wojtowicz .................. 257/198 |

OTHER PUBLICATIONS

Oka, T. et al."Low turn–on voltage GaAs heterojunction bipolar transistors with a pseudomorphic GaAsSb base" *Applied Physics Letters*. Jan. 22, 2001; 78(4):483–485.

Sullivan, G.J. et al. "High Gain AlInAs/GaAsSb/AlInAs NpN HBTs on InP" *Journal of Electronic Materials*, 1992; 21(12): 1123–1125.

Yan, B.P. et al. "Low Turn–on Voltage InGaP/GaAsSb/GaAs Double HBTs Grown by MOCVD" *IEEE Electron Device Letters* 2002 Apr. 23(4):170–172.

Yan, B.P. et al. "InGaP/GaAsSb/GaAs DHBT s with Low Turn–on Voltage and High Current Gain" *14th Indium Phosphide and Related Materials Conference(IPRM'02)*, May 12–16, 2002, Stockholm, Sweden, pp. 169–172.

* cited by examiner

*Primary Examiner*—David Nelms
*Assistant Examiner*—Dao H. Nguyen
(74) *Attorney, Agent, or Firm*—Lahive & Cockfield, LLP; Anthony A. Laurentano, Esq.

(57) ABSTRACT

A heterojunction bipolar transistor is provided having an improved current gain cutoff frequency. The heterojunction bipolar transistor includes a graded base layer formed from antimony. The graded base allows the heterojunction bipolar transistor to establish a quasi-electric field to yield an improved cutoff frequency.

16 Claims, 3 Drawing Sheets

GRADED BASE GAASSB FOR HIGH SPEED GAAS HBT

RELATED APPLICATIONS

This application claims priority to U.S. provisional application Serial No. 60/306,796, filed on Jul. 20, 2001, and entitled Graded Base GaAsSb for High Speed GaAs HBT.

BACKGROUND OF THE INVENTION

This invention relates generally to semiconductor transistors. In particular, the invention relates to heterojunction bipolar transistors. Heterojunction bipolar transistors (HBTs) offer much higher speed of operation than the more prevalent metal-oxide-semiconductor field-effect transistors (MOSFETs) or even conventional homojunction bipolar transistors, e.g., pnp or npn silicon transistors. Because HBTs offer high speed, a high current driving capability, and a low l/f noise levels, HBTs are becoming popular for use as integrated switching devices and microwave devices in wireless communications systems and sub-systems, satellite broadcast systems, automobile collision avoidance systems, global positioning systems, and other high-frequency applications. One application in which HBT use is increasing is in the design and manufacture of wireless electronic devices, such as wireless telephones and other like electronic devices that are capable of communicating with a network in a wireless manner.

Although HBT's offer many benefits over bipolar silicon transistors, there remains a need to improve or extend the frequency response of a GaAs based HBT. One manner to extend the frequency response of a GaAs based HBT is to establish a gradual change in bandgap across the base layer of the HBT. The bandgap shift establishes a conduction band energy gradient that constitutes a quasi-electric field that drives electrons across the base layer by drift and by diffusion. As such, the amount of time necessary for electrons to traverse the base layer is significantly reduced. Moreover, the graded base layer operates to minimize the electron transit time in the base region thus, increasing the frequency at which the HBT incremental current gain drops to unity or often referred to as the current-gain cutoff frequency ($f_T$).

The beneficial effects of base grading have been demonstrated in AlGaAs and InGaAs base layer grading. Unfortunately, the aluminum in the AlGaAs device demonstrates a high affinity for atmospheric oxygen. The oxygen, especially at a heterostructure interface, tends to degrade electrical properties of the device over time. The degraded electrical properties are often manifested in reduced mobilities and carrier trapping. Moreover, it has also been demonstrated that the indium material in the InGaAs HBT has several undesirable properties. The amount of indium that can be incorporated into a graded base layer is limited due limitations in the critical layer thickness. The addition of indium tends to decrease the acceptor impurity incorporation, which is not desirable.

SUMMARY OF THE INVENTION

The present invention provides a graded base GaAs HBT having an increased or extended frequency response that addresses the above-described problems associated with graded base AlGaAs and InGaAs HBT devices. This is accomplished by the introduction of antimony (Sb) in a graded base layer of a GaAs-based HBT.

The heterojunction bipolar transistor of the present invention includes a collector region having at least one layer disposed on a substrate to form a first stack, a graded base region having at least one layer disposed on a portion of the collector region to form a second stack. The HBT further includes emitter region having at least one layer disposed over a portion of the graded base region to form a third stack and a contact region having at least one layer disposed over a portion of the emitter region to form a fourth stack. The graded base layer is doped with an impurity concentration that gradually increases from a first surface of the graded base layer adjacent to a first layer of the first stack to a second surface of the graded base layer adjacent to a layer of the third stack within the heterojunction bipolar transistor. The grading and the doping of the base layer with a high concentration of impurities results in a reduction of a base resistance value for the HBT, which, in turn, improves or extends the current gain cutoff frequency ($f_T$) to about 100 GHz of the HBT.

The present invention also provides a method for forming a compound semiconductor device having an extended frequency response. The method provides for forming on a substrate a collector region having at least one layer to form to a first stack and forming a base region having at least a graded base layer on a portion of the collector region to form a second stack. The method further provides for forming an emitter region having at least one layer on a portion of the base region to form a third stack, and forming a contact region having at least one layer on a portion of the emitter region to form a fourth stack. The forming of the graded base layer allows the fabricated compound semiconductor device to realize a quasi-electric field to reduce the base transit time of electrons. The method further provides for doping of the graded base layer in a high concentration of impurities to reduce a resistance value associated with the graded base layer to improve or extend the $f_T$ of the device to about 100 GHz.

BRIEF DESCRIPTION OF THE DRAWINGS

The foregoing and other objects, features and advantages of the invention will be apparent from the following description, and from the accompanying drawings, in which like reference characters refer to the same parts throughout the different views. The drawings illustrate principles of the invention and are not to scale.

DETAILED DESCRIPTION OF THE INVENTION

The compound semiconductor of the present invention employs a graded base layer to allow the compound semiconductor device to realize an improved or extended frequency response. The $f_T$ realized by the compound semiconductor device extends or improves the frequency response of the device to about 100 GHz. The improved cutoff frequency of the compound semiconductor is particularly suitable for applications where the compound semiconductor device operates as a power amplifier and is fabricated from GaAs based material. Specifically, each of the illustrative embodiments described below are directed to GaAs based HBT device for use in portable or mobile electronic devices, such as cellular telephones, laptop computers with wireless modems and other like portable consumer devices, or other wireless communication devices and systems, such as satellite systems, terrestrial based systems, or a hybrid of terrestrial and satellite based systems. The compound semiconductor device of the present invention is configurable to suit a selected application as illustrated in the exemplary embodiments described in more detail below.

The compound semiconductor device of the present invention provides a range of significant benefits to engineers that design electronic devices capable of communicating with a network in a wireless manner. The compound semiconductor device of the present invention can extend or increase the cutoff frequency of the electronic device that communicates with a network in a wireless manner to provide the device or network with an improved bandwidth. The compound semiconductor device of the present invention is able to improve or extend the $f_T$ of power amplifier HBTs fabricated from GaAs.

Figure 1:
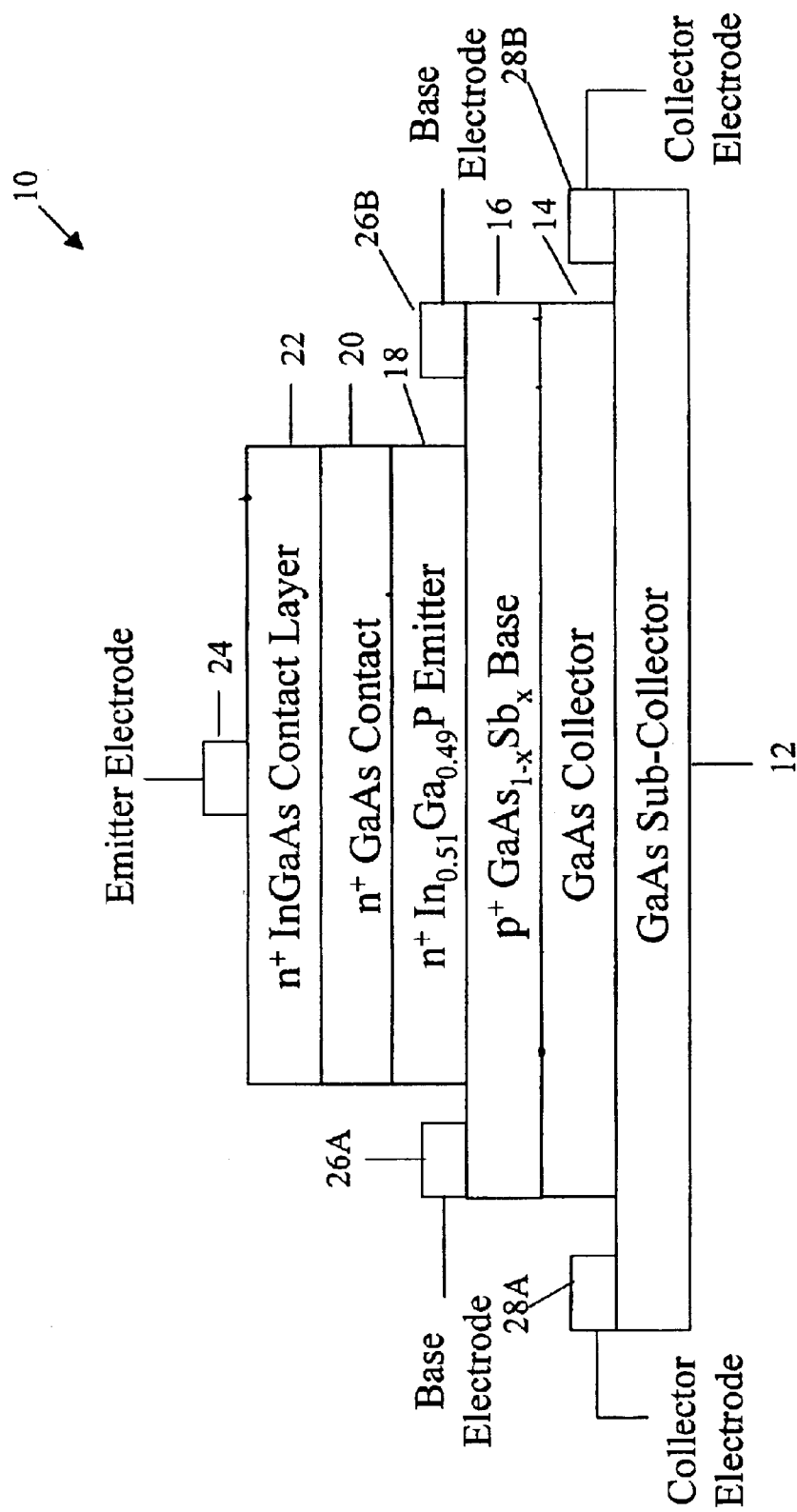
FIG. 1 is a cross-sectional view of a heterojunction bipolar transistor according to a first illustrative embodiment of the present invention.

FIG. 1 illustrates a cross-sectional view of an HBT according to a first illustrative embodiment of the present invention. The HBT 10 includes a collector region, a base region, an emitter region, and a contact region. The collector region of the HBT 10 includes a sub-collector layer 12 and a collector layer 14. The base region of the HBT 10 includes a graded base layer 16. In similar fashion, the emitter region of the HBT 10 includes an emitter layer 18. In like manner, the contact region of the HBT 10 includes a contact 20, and a contact layer 22. The HBT 10 further includes an emitter electrode 24 formed over a portion of the contact layer 22, base electrodes 26A and 26B formed over portions of the graded base layer 16, and collector electrodes 28A and 28B formed over portions of the sub-collector layer 12.

In more detail, the sub-collector layer 12 is a GaAs material formed over a substrate and has a thickness of about 500 nm with a donor impurity concentration of about $4\times10^{18}$ cm$^{-3}$. The thickness of the sub-collector layer 12 can be incrementally changed in 1 nm increments in a range from between about 500 nm and about 1,500 nm to reach a desired value. The collector layer 14 is formed over a portion of the sub-collector layer 12. The formed GaAs material of the collector layer 14 has a thickness of about 200 nm and is doped to have a donor impurity concentration of about $1\times10^{16}$ cm$^{-3}$. The collector layer 14 can have its thickness incrementally changed in 1 nm increments in a range from between about 100 nm and about 400 nm to a desired thickness.

The graded base layer 16 is a GaAs$_{1-x}$Sb$_x$ material, where x is from 0 to 0.30, formed over a portion of the collector layer 14 and is formed to have a thickness of less than about 100 nm and doped with p$^+$ impurities to have an acceptor concentration of about $4\times10^{19}$ cm$^{-3}$. It is desirable to form the graded base layer 16 of a P$^+$ type GaAs$_{1-x}$Sb$_x$ material. A typical base graded layer of GaAs$_{1-x}$Sb$_x$ can be (x from 0 to 0.20) at a thickness of 50 nm. It is further desirable to form the graded base layer 16 to have a thickness of between about 20 nm and about 40 nm. The thickness of the graded base layer 16 can be incrementally changed in 1 nm increments across the range of thickness to reach a desired value. The graded base layer 16 is graded in a manner to realize a quasi-electric field to drive electrons across the graded base layer 16 by drift and by diffusion, which, in turn, allows the HBT 10 to realize an $f_T$ of about 100 GHz.

The graded base layer 16 is graded and formed to have a thickness that is suitable for establishing a quasi-electric field, which reduces the electron base transit time. Furthermore, the use of Sb in the graded base layer 16 provides significant benefits over the use of indium in a graded base HBT. For example, the graded base layer 16 of the HBT 10 can be heavily doped with carbon, in contrast to indium, to reduce a base resistance value of the HBT 10. As a result, the HBT 10 realizes an extended $f_T$ to improve the operating characteristics and the operating range of the device. Furthermore, the inclusion of Sb in the graded base layer 16 allows the HBT 10 to realize a slight reduction in turn-on voltage ($V_{BE}$) of between 20–50 meV. The lower $V_{BE}$ is realized by the reduction of the energy gap of the graded base layer 16 by the addition of Sb.

The emitter layer 18 is formed of an In$_{0.51}$Ga$_{0.49}$P material over a portion of the graded base layer 16. The emitter layer 18 is doped with N impurities in a concentration of about $3\times10^{17}$ cm$^{-3}$. The emitter layer 18 is formed to have a thickness of about 50 nm. The emitter layer 18 can have a thickness of between about 10 nm and about 200 nm. The thickness of the emitter layer 18 can be incrementally changed in 1 nm increments across the thickness range to reach a desired thickness value.

The contact layer 20 is an GaAs material doped with N type impurities in a concentration of about $4\times10^{18}$ cm$^{-3}$. The contact layer 20 is formed so as to have a thickness of about 100 nm. The contact layer 22 is formed from an In$_x$Ga$_{1-x}$As (x=0.0 up to 0.6) material doped with N type impurities in a high concentration in excess of $1\times10^{19}$ cm$^{-3}$. It is desirable for the contact layer 22 to be formed from an In$_x$Ga$_{1-x}$As material doped with N type impurities at a high concentration in excess of $1\times10^{19}$ cm$^{-3}$. A contact layer could be In$_x$Ga$_{1-x}$As where the composition (x) varied linearly from 0 to 0.6 with a total thickness of 100 nm. The thickness of the contact layer 22 can range from between about 50 nm to about 300 nm in increments or decrements of about 1 nm.

Figure 2:
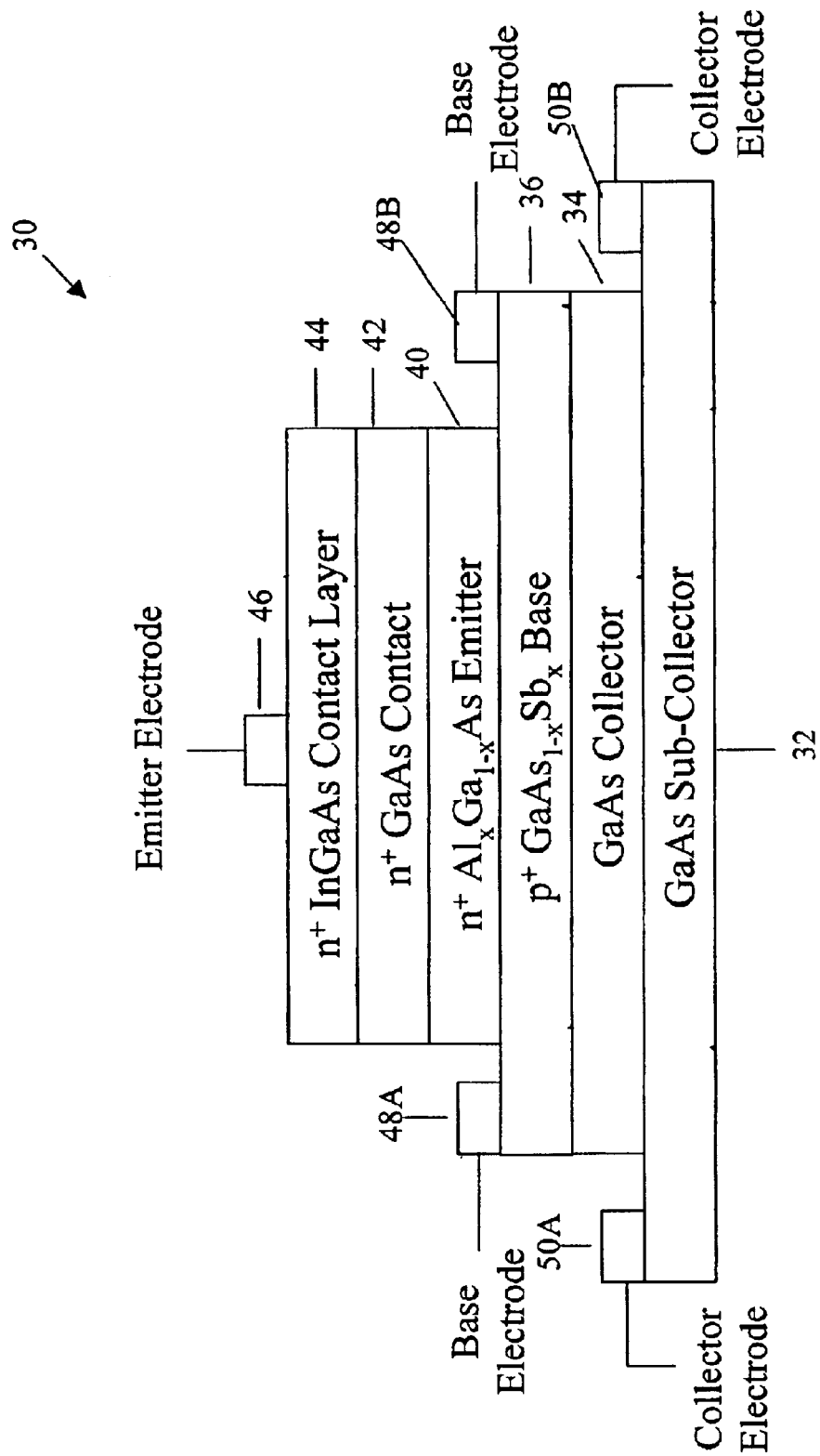
FIG. 2 is a cross-sectional view of a heterojunction bipolar transistor according to a second illustrative embodiment of the present invention.

FIG. 2 illustrates a cross-sectional view of an HBT according to a second illustrative embodiment of the present invention. The HBT 30 includes a collector region, a base region, an emitter region, and a contact region. The collector region of the HBT 30 includes a sub-collector layer 32 and a collector layer 34. The base region of the HBT 30 includes a graded base layer 36. In similar fashion, the emitter region of the HBT 30 includes an emitter layer 40. In like manner, the contact region of the HBT 30 includes a contact 42, and a contact layer 44. The HBT 30 further includes an emitter electrode 46 formed over a portion of the contact layer 44, base electrodes 48A and 48B formed over portions of the graded base layer 36, and collector electrodes 50A and 50B formed over portions of the sub-collector layer 32.

In more detail, the sub-collector layer 32 is a GaAs material formed over a substrate and has a thickness of about 500 nm with a donor impurity concentration of about $4\times10^{18}$ cm$^{-3}$. The sub-collector layer 32 can have a thickness from between about 500 nm to about 1,500 nm. The thickness of the sub-collector layer 32 can be changed in increments of 1 nm. The collector layer 34 is formed of a GaAs material over a portion of the sub-collector layer 32. The formed GaAs material of the collector layer 34 has a thickness of about 200 nm and is doped to have an n-type impurity concentration of about $1\times10^{16}$ cm$^{-3}$. The collector layer 34 can have its thickness changed in 1 nm increments in a range from between about 100 nm to about 400 nm.

The graded base layer 36 is a GaAs$_{1-x}$Sb$_x$ (x from about 0 to 0.30) material formed over a portion of the collector layer 34 and is formed to have a thickness of less than about 100 nm and doped to have a high impurity concentration of about $4\times10^{19}$ cm$^{-3}$. It is desirable to form the graded base layer 36 of a P$^+$ type GaAs$_{1-x}$Sb$_x$ material. A typical base graded layer of GaAs$_{1-x}$Sb$_x$ can be (x from 0 to 0.20) at a thickness of 50 nm. It is further desirable to form the graded base layer 36 to have a thickness of between about 20 nm and about 100 nm. The thickness of the graded base layer 36 can be changed in increments of 1 nm. The graded base layer 36 is graded in a manner to realize a quasi-electric field to drive electrons across the graded base layer 36 by drift and by diffusion, which, in turn, allows the HBT 30 to realize an $f_T$ of greater than about 100 GHz.

The graded base layer 36 is graded and formed to have a thickness that is suitable for establishing a quasi-electric field, which reduces an electron base transit time. Furthermore, the use of Sb in the graded base layer 36 provides significant benefits over the use of indium in a graded base HBT. For example, the graded base layer 36 of the HBT 30 can be heavily doped with carbon, in contrast to indium, to reduce a base resistance value of the HBT 30. As a result, the HBT 30 realizes an extended $f_T$ to improve the operating characteristics and the operating range of the device. Furthermore, the inclusion of Sb in the graded base layer 36 allows the HBT 30 to realize a turn-on voltage ($V_{BE}$) reduction of 20–50 mV. The lower $V_{BE}$ is realized by the reduction of the energy gap of the graded base layer 36 by the addition of Sb.

The emitter layer 40 is formed of an Al$_x$Ga$_{1-x}$As (0.0<x<0.5) material over a portion of the emitter buffer layer 112. The emitter layer 40 is doped with N-type impurities in a concentration of about $4\times10^{17}$ cm$^{-3}$. The emitter layer 40 is formed to have a thickness of between about 10 nm to about 200 nm in 1 nm increments. It is desirable to form the emitter layer 40 with a thickness of about 20 nm.

The contact layer 42 is an GaAs material doped with N type impurities in a concentration of about $4\times10^{18}$ cm$^{-3}$. The contact layer 42 is formed to have a thickness of about 100 nm. The contact layer 44 is formed from an In$_x$Ga$_{1-x}$As (x=0.0 up to 0.6) material doped with N type impurities in a high concentration in excess of $1\times10^{19}$ cm$^{-3}$. It is desirable for the contact layer 44 to be formed from an In$_x$Ga$_{1-x}$As material doped with N type impurities at a high concentration in excess of $1\times10^{19}$ cm$^{-3}$. A contact layer could be In$_x$Ga$_{1-x}$As where the composition (x) varied linearly from 0 to 0.6 with a total thickness of 100 nm. The thickness of the contact layer 44 can range from between about 50 nm to about 300 nm in increments or decrements of about 1 nm.

Figure 3:
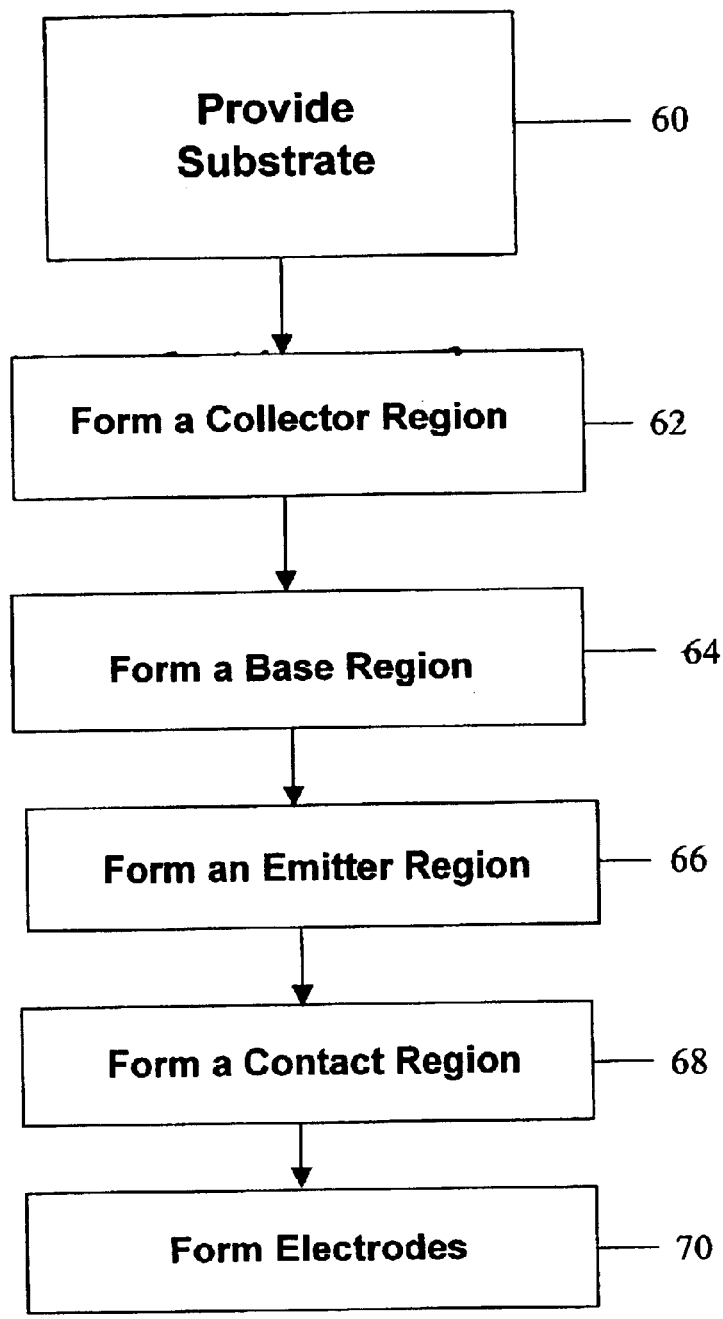
FIG. 3 is a schematic flow chart diagram illustrating the method for fabricating one or more of the heterojunction bipolar transistors illustrated in FIGS. 1–2.

FIG. 3 illustrate the steps taken to form one of the illustrative compound semiconductor devices of the present invention. On a provided substrate (step 60) a collector region is formed having at least one layer to form a first stack (step 62). Suitable techniques for forming the collector region include metal organic chemical vapor deposition (MOCVD) or molecular beam epitaxy (MBE). Upon formation of the collective region, a base region is formed or grown over a portion of the collector region (step 64). The base region is formed to include at least one layer and forms a second stack. An emitter region is grown or formed over a portion of the base region to form a third stack (step 66). The emitter region is formed to have at least one layer. In similar fashion, a contact region is grown or formed over a portion of the emitter region to form a fourth stack (step 68). The contact region is formed to have at least one layer. The emitter electrode, the base electrodes, and the collector electrodes are formed by metal deposition and liftoff, self-aligned or non-self-aligned, using a material of Ti, Au, W, Ni, Ge, and Pt (step 70). Those skilled in the art will recognize that each of the stacks discussed above are capable of being formed by MOCVD or by MBE. Nonetheless, those skilled in the art will recognize that other fabrication methods may be suitable depending on feature sizes or other constraints such as material type.

Those skilled in art will appreciate that the applications of the various compound semiconductor devices described herein are not limited solely to portable or mobile electronic devices capable of communicating with a network in a wireless manner. For example, the compound semiconductor devices of the present invention are configurable for use in a satellite or in any other electronic system or sub-system concerned with improving or extending the frequency response of all or part of the electronic system or sub-system.

While the present invention has been described with reference to illustrative embodiments thereof, those skilled in the art will appreciate that various changes in form in detail may be made without parting from the intended scope of the present invention as defined in the appended claims.

What is claimed is:

1. A heterojunction bipolar transistor, comprising
   a collector layer disposed on a substrate to form a first stack,
   a graded base layer having a gradually varied composition disposed on a portion of the collector layer to form a second stack,
   an emitter layer disposed on a portion of the base layer to form a third stack, and
   a contact layer disposed on a portion of the emitter layer to form a fourth stack, wherein an impurity concentration within the graded base layer gradually increases from a first surface of the graded base layer adjacent a layer of the first stack to a second surface of the graded base layer adjacent a layer of the third stack within the heterojunction bipolar transistor to allow the heterojunction bipolar transistor to generate an energy gradient of a sufficient value to realize a current gain cutoff frequency ($f_T$) in excess of 100 GHz.

2. The heterojunction bipolar transistor of claim 1, wherein the first stack comprises
   a collector region, and
   a sub-collector region, wherein the sub-collector region has a relatively heavy concentration of n-type dopant impurities and the collector region has a relatively light concentration of n-type dopant impurities.

3. The heterojunction bipolar transistor of claim 2, wherein the sub-collector region comprises, GaAs having a thickness of between about 500 nm and about 2000 nm.

4. The heterojunction bipolar transistor of claim 2, wherein the collector region comprises, GaAs having a thickness of between about 100 nm and about 400 nm to reduce collector transit time and improve a frequency response of the heterojunction bipolar transistor.

5. The heterojunction bipolar transistor of claim 3, wherein the first contact region comprises, GaAs having a thickness of between about 50 nm and about 300 nm.

6. The heterojunction bipolar transistor of claim 5, wherein the first contact region comprising GaAs has a thickness of about 100 nm.

7. The heterojunction bipolar transistor of claim 3, wherein the second contact region comprises, InGaAs having a thickness of between about 50 nm and about 200 nm.

8. The heterojunction bipolar transistor of claim 7, wherein the second contact region comprises InGaAs has a thickness of about 100 nm.

9. The heterojunction bipolar transistor of claim 3, wherein the sub-collector region further comprises, a metallization layer contacting at least a portion of a surface of the sub-collector region.

10. The heterojunction bipolar transistor of claim 7, wherein the second contact region further comprises, a metallization layer contacting at least a first portion of a surface of the second contact region.

11. The heterojunction bipolar transistor of claim 1, wherein the third stack comprises an emitter region.

12. The heterojunction bipolar transistor of claim 1, wherein the fourth stack comprises a first contact region, and a second contact region.

13. The heterojunction bipolar transistor of claim 12, wherein the emitter region comprises, a material selected from one of, $In_{0.51}Ga_{0.49}P$ having a thickness between about 10 and about 200 nm and one of, $Al_xGa_{1-x}As$ (0.0<x<0.5) having a thickness between 10 to 200 nm.

14. The heterojunction bipolar transistor of claim 1, wherein the graded base region comprises, $GaAs_{1-x}Sb_x$ (x from about 0.0 to about 0.3) having a thickness of less than about 100 nm.

15. The heterojunction bipolar transistor of claim 14, wherein the graded base region has a thickness of between about 20 nm and about 100 nm.

16. The heterojunction bipolar transistor of claim 14, wherein the graded base region further comprises, a metallization layer contacting at least a first portion of a surface of the graded base region.

* * * * *